(12) United States Patent
Jadcherla

(10) Patent No.: US 7,984,398 B1
(45) Date of Patent: Jul. 19, 2011

(54) AUTOMATED MULTIPLE VOLTAGE/POWER STATE DESIGN PROCESS AND CHIP DESCRIPTION SYSTEM

(75) Inventor: Srikanth Jadcherla, Campbell, CA (US)

(73) Assignee: Synopsys, Inc., Mountain View, CA (US)

( * ) Notice: Subject to any disclaimer, the term of this patent is extended or adjusted under 35 U.S.C. 154(b) by 228 days.

(21) Appl. No.: 11/180,404

(22) Filed: Jul. 12, 2005

Related U.S. Application Data

(60) Provisional application No. 60/589,330, filed on Jul. 19, 2004.

(51) Int. Cl.
*G06F 17/50* (2006.01)
*G06F 9/455* (2006.01)

(52) U.S. Cl. ......... 716/106; 716/104; 716/126; 716/127

(58) Field of Classification Search .................. 716/5, 1, 716/106, 127
See application file for complete search history.

(56) References Cited

U.S. PATENT DOCUMENTS

| | | | | |
|---|---|---|---|---|
| 5,555,201 A * | 9/1996 | Dangelo et al. | .................... | 716/1 |
| 5,801,958 A * | 9/1998 | Dangelo et al. | .................. | 716/18 |
| 5,812,416 A * | 9/1998 | Gupte et al. | ........................ | 716/2 |
| 5,940,779 A * | 8/1999 | Gaitonde et al. | ................ | 702/60 |
| 6,523,150 B1 * | 2/2003 | Buffet et al. | ........................ | 716/4 |
| 6,792,582 B1 * | 9/2004 | Cohn et al. | ......................... | 716/7 |
| 7,000,214 B2 * | 2/2006 | Iadanza et al. | .................. | 716/18 |
| 7,103,862 B2 * | 9/2006 | Sung et al. | ......................... | 716/5 |
| 7,428,675 B2 * | 9/2008 | Gattiker et al. | ................ | 714/726 |
| 2001/0049812 A1 * | 12/2001 | Lutkemeyer | ...................... | 716/6 |
| 2004/0060023 A1 * | 3/2004 | Bednar et al. | ...................... | 716/7 |
| 2004/0187085 A1 * | 9/2004 | Sinha et al. | ....................... | 716/4 |
| 2004/0243958 A1 * | 12/2004 | Bednar et al. | ..................... | 716/7 |
| 2004/0268278 A1 * | 12/2004 | Hoberman et al. | ............... | 716/5 |
| 2005/0108667 A1 * | 5/2005 | Iadanza et al. | ..................... | 716/4 |
| 2005/0120322 A1 * | 6/2005 | Chen et al. | ...................... | 716/13 |
| 2006/0265681 A1 * | 11/2006 | Bakir et al. | ..................... | 716/10 |
| 2007/0011643 A1 * | 1/2007 | Wang et al. | ..................... | 716/18 |
| 2009/0307637 A1 * | 12/2009 | Lichtensteiger et al. | ......... | 716/4 |

* cited by examiner

*Primary Examiner* — Vuthe Siek
*Assistant Examiner* — Patrick Sandoval
(74) *Attorney, Agent, or Firm* — Park, Vaughan, Fleming & Dowler LLP

(57) ABSTRACT

Systems and methods are disclosed herein which compensate for the loss in design information that occurs when the design is represented in traditional functional descriptions. An automated multiple voltage/power state design process includes creating a plurality of design objects; processing a design definition according to the voltage effects design object; and generating a modified design output such that communication between a plurality of design process steps, wherein the plurality of design process steps include a parsing step, a RTL simulation step, a synthesis step, a gate simulation step, formal verification step, and physical design and verification step in accordance with the voltage effects design object. A system for automating a multiple voltage/power state design process includes a design definition module; a parser module, a RTL simulation module, a synthesis module, a gate simulation module, and a formal verification module wherein the automation of a multiple voltage/power state design process is achieved. The system can include a physical design and verification module coupled to the synthesis module.

3 Claims, 10 Drawing Sheets

```
Power_net indicator = <signal_name>;
legal_values = {list};
standby_voltage = {list};
        good2down = <value>; // power "assertions"
        up2good = <value>;
        good2rst = <value>;
rstsignals = {list};
grid = {DEF/PDEF fragment};
decap = <value>;
IR_drop_max = <value>;
max_di_dt = <value>;

method calculate_decap (grid segment, grid cap, max_di_dt) {
        <code links to tool objects>
}
```

```
Eda_tool
    exec_name = <value>;
       version = <value>;
       lic_file = <value>;
       init_file = <value>;
       options = <value>;
       logfile = <design objects>;
       source_files = <design objects>;
       outputs = <design objects>;
    method run {
       exec_name <options> <version> <logfile>
          <source_files> ...
    }
```

FIG. 6

```
eco         changed_modules = <design objects>;        method run_eco {
            approval_list = <people objects>              <code connects tool object from here>
            exec = <tool object>;                       }
            bug_number = <design object>;
```

| Engineer | username = <value>;<br>groups = <value>;<br>allowed_modules = <value>;<br>allowed_objects = <value>;<br>manager = <value>;<br>underlings = <value>; | method get_eco_approval {<br>  <code here><br>  <links to relevant design, tool,<br>  process object here><br>} |
|---|---|---|
| 813 | 823 | 833 |

FIG. 8

AUTOMATED MULTIPLE VOLTAGE/POWER STATE DESIGN PROCESS AND CHIP DESCRIPTION SYSTEM

RELATED APPLICATIONS

This application claims priority to Provisional Application Ser. No. 60/589,330, filed Jul. 19, 2004, the benefit of the filing date of which is hereby claimed under 35 U.S.C. §119(e).

BACKGROUND

1. Field

This invention relates to the art of electronic design automation (EDA), and more specifically to an automated design process and chip description system.

2. Related Art

In the art of semiconductor chip design, tools such as electronic design automation (EDA) are used to provide a means for automating the design of Integrated Circuits (IC) and Systems on a Chip (SoC) so that the design can be tested prior to the expensive process of implementing the design in silicon. Tools are also provide a means of automating the task(s) of preparing the design for manufacture on silicon.

Hardware Description Languages (HDL) are used to model a chip and its functions. Existing HDL technology places the main functional description of Integrated Circuits (IC) and Systems on a Chip (SoC) in Register Transfer Language (RTL) source files.

The RTL source files do not include information about various non-functional aspects of the design. Such non-functional aspects include voltages, clock rates, etc. Specifically, such source files do not have a provision to express control of the design using voltage states. Hence, it is not possible to simulate, synthesize, perform physical design or formally verify a design with multiple voltage states at the RTL and gate-level abstractions without manual intervention to compensate for the loss of voltage-related information. Non-functional aspects of the design are typically described in constraint (input/output) files and scripts; text documents and email messages; oral communications between design team members and other members of the project team; tags; spreadsheets; and programs, formats and databases that are not necessarily directly connected to the databases that are used for implementation and verification.

What is needed is a system and method that compensates for the loss in design information that occurs when the design is represented in traditional functional descriptions.

SUMMARY

Systems and methods are disclosed herein which compensate for the loss in design information that occurs when the design is represented in traditional functional descriptions. In an embodiment of the invention, an automated multiple voltage/power state design process comprises the steps of: applying a design definition to create a plurality of design definition objects, wherein the design definition objects includes voltage control and consequence; parsing the design definition objects to create a plurality of parsed design objects, wherein the plurality of parsed design objects includes voltage control and consequence; simulating the parsed design objects using RTL to create a plurality of RTL simulated design objects, wherein the plurality of RTL simulated design objects includes voltage control and consequence; synthesizing the parsed design objects to create a plurality of synthesized design objects, wherein the plurality of synthesized design objects includes voltage control and consequence; simulating the synthesized objects with a gate level simulator to create a plurality of simulated gate level design objects, wherein the plurality of simulated gate level design objects includes voltage control and consequence; verifying a plurality of synthesized design objects with a plurality of formal verification rules, wherein the plurality of formal verification rules includes voltage control and consequence; and performing the physical design and verification, wherein the plurality of physical design and verification design objects includes voltage control and consequence.

A system for automating a multiple voltage/power state design process is also disclosed in accordance with an embodiment of the invention. The system comprises: a design definition module; a parser module coupled to the design definition module, wherein the parser creates a plurality of parsed design objects from a plurality of design definition design objects, wherein the plurality of parsed design objects includes voltage control and consequence; a RTL simulation module coupled to the parser module, wherein the RTL simulation module creates a plurality of RTL simulated design objects from a plurality of parsed design objects, wherein the plurality of RTL simulated design objects includes voltage control and consequence; a synthesis module coupled to the parser module, wherein the synthesis module creates a plurality of synthesized design objects from a plurality of parsed design objects, wherein the plurality of synthesized design objects includes voltage control and consequence; a gate simulation module coupled to the synthesis module, wherein the gate simulation module creates a plurality of gate level simulated design objects from a plurality of synthesized design objects, wherein the plurality of gate level design simulated objects includes voltage control and consequence; a formal verification module coupled to the synthesis module, wherein the formal verification module creates a plurality of formally verified design objects from a plurality of synthesized design objects, wherein the plurality of formally verified design objects includes voltage control and consequence; and wherein the automation of a multiple voltage/power state design process is achieved.

A system for automating a multiple voltage/power state design process can further comprise a physical design and verification module coupled to the synthesis module, wherein the physical design and verification module creates a plurality of physical designed and verified design objects.

An automated design process is also disclosed, comprising the steps of: creating a plurality of design objects, the design objects including a plurality of formal expressions for voltage effects in a design definition; processing a design definition according to the voltage effects design object; and generating a modified design output such that communication between a plurality of design process steps, wherein the plurality of design process steps include a parsing step, a RTL simulation step, a synthesis step, a gate simulation step, formal verification step, and physical design and verification step in accordance with the voltage effects design object.

BRIEF DESCRIPTION OF THE DRAWINGS

FIG. 5 is a diagram showing an example of a design object in accordance with an embodiment of the invention.

FIG. 6 is a diagram showing an example of a tool object in accordance with an embodiment of the invention.

FIG. 7 is a diagram showing an example of a process object in accordance with an embodiment of the invention.

FIG. 8 is a diagram showing an example of a people object in accordance with an embodiment of the invention.

DETAILED DESCRIPTION

Figure 1:
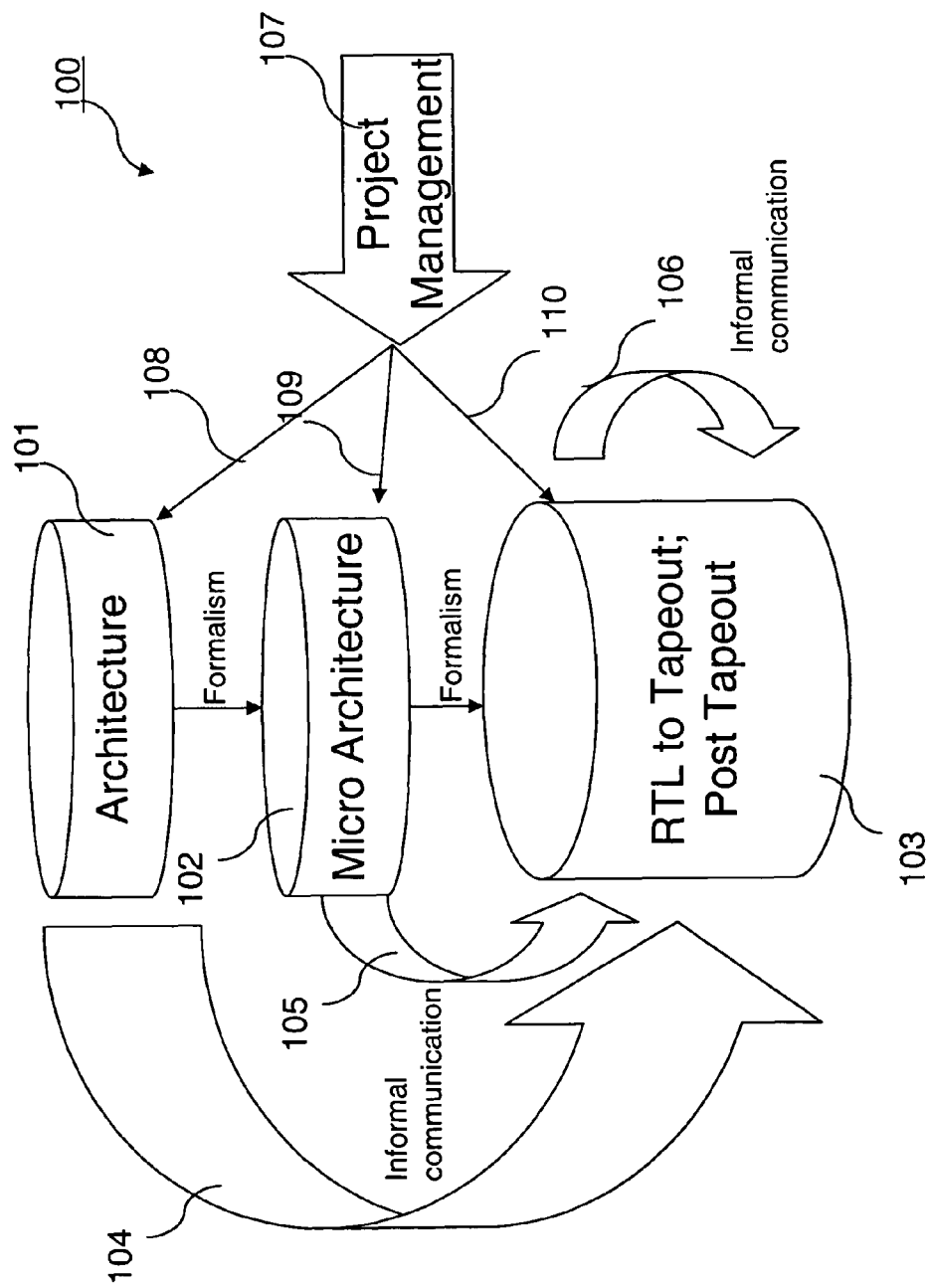
FIG. 1 is a block diagram showing a prior art automated design process.

The following serves as a glossary of terms as used herein:

CDS: Chip Description Language, as described below in this detailed description.

Constraints: commands used along with the RTL as inputs to various execution engines to provide additional specification not contained in the RTL.

Design tasks: tasks that are relevant for the implementation and verification of a design.

DFM: Design for Manufacturing, a rule and process set aimed at avoiding and reducing manufacturing errors.

DRC: Design Rule Checking, a process by which rules to ensure the safe realization of a design are checked.

LVS: Layout Verification to Schematic, a process by which polygon representations of the hardware are verified against a connectivity description.

Methods: procedures or functions that are declared and called by objects.

Object: An "object" is a collection of data fields (storage elements) and methods (associated functions).

Object Pool: a plurality of objects that are used to model the properties of an Integrated circuit as well as its development by people, tools (programs) and processes; a database of chip description system (CDS) objects. The contents of the object pool and interaction of methods and storage elements therein is customizable by the user and is variable with the needs of silicon technology.

Process: A process is a special object that is primarily used to create/modify/transform design data that may be stored in the data fields of objects or otherwise. A process has "input" data fields and "output" data fields, not necessarily mutually exclusive.

RTL: Register Transfer Language, usually in Verilog/VHDL. RTL files contain a functional description of hardware that is executable by design automation tools. RTL may be subject to higher levels of abstraction in the future, to which the methods of this invention can apply.

RTL to Tapeout: refers to the current EDA paradigm where a common design environment exists from RTL stage to usually shipping the design to the foundry in a format known as GDSII. industry standard term for submitting an Integrated Circuit design for manufacture.

SoC: System on a Chip, refers to a complex Integrated Circuit (IC) with varied circuit types in it.

Tools: refers generally to programs that accomplish or aid the automation of design tasks, for example, EDA tools or scripts that are used for IC design tasks.

uArch: Micro-Architecture, is planning for the detailed architecture of hardware; precedes RTL development and is a basis for partitioning the chip and deriving constraints.

Voltage Island: A partition of the design which derives its power supply from a source not shared with another partition. Such a partition influences the interaction of electrical signals in a voltage island with those of another or among themselves. Such a partition also influences the stability of operation of a voltage island as voltage control is exercised. The claims described herein to address such voltage control and consequence can be also applied to reset signals, analog interfaces, bus signals and multiple IC systems that have voltage variant behavior.

Voltage/Power State: The state of a set of voltage islands at a point in time.

An automated design process and chip description system (CDS) compensates for the loss in design information that occurs when the design is represented in traditional functional descriptions by including non-functional information that is useful for improving the productivity and for addressing risk problems.

This non-functional aspects include clock rates, etc. Specifically, the indication of voltage related control and effects are not modeled in Hardware description languages used to automate the implementation and verification of Integrated Circuits. Non-functional aspects of the design are typically described in constraint (input/output) files and scripts; text documents and email messages; oral communications between design team members and other members of the project team; tags; spreadsheets; and programs, formats and databases that are not necessarily directly connected to the databases that are used for implementation and verification.

FIG. 1 is a block diagram 100 showing a prior art automated design process. Formal interactions between an architecture 101 and a micro architecture 102, and between the micro architecture 102 and a common EDA environment called RTL to Tapeout 103. Information communications among the architecture 101, micro architecture 102, and RTL to Tapeout 103 are shown by arrows 104-106. Project management information 107 is introduced into the design environment by the paths shown by arrows 108-110.

Automated Design Process and Chip Description System

Figure 2:
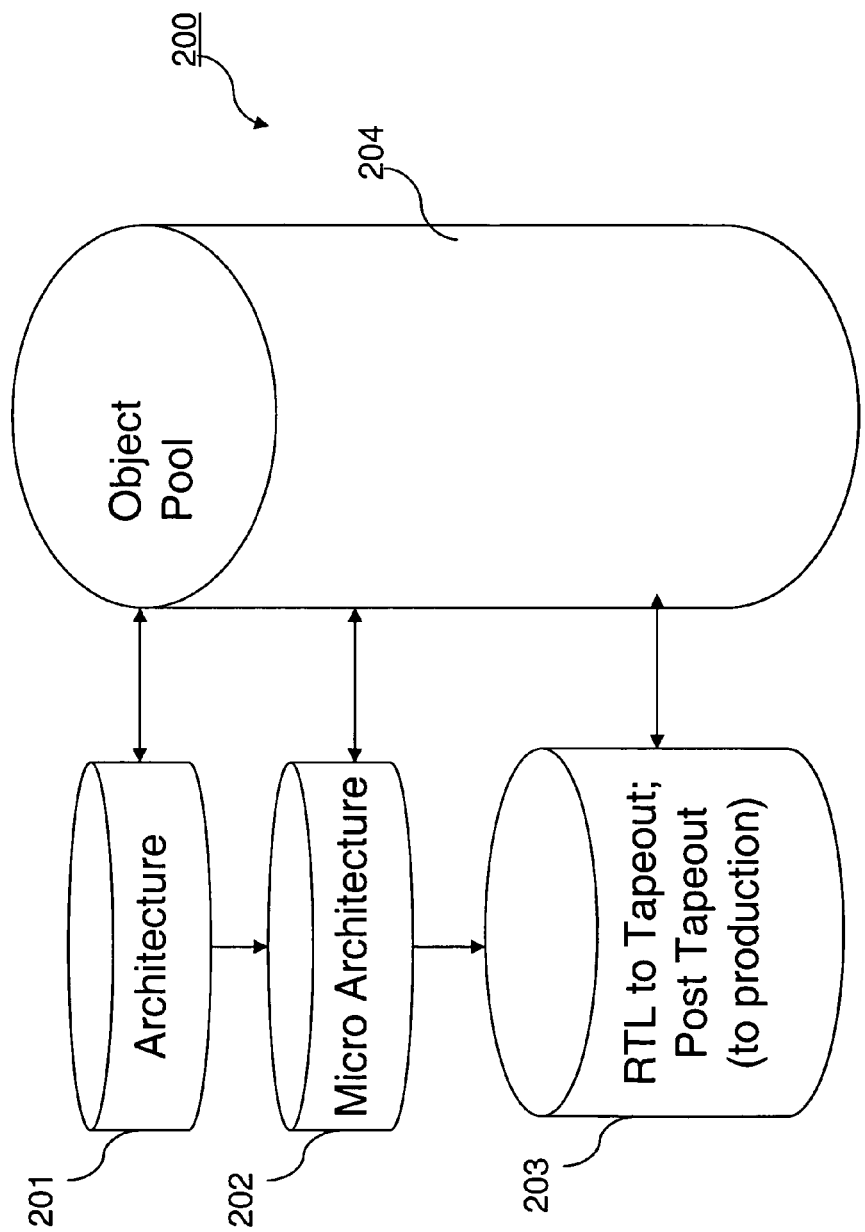
FIG. 2 is a block diagram showing an automated design process and chip description system in accordance with an embodiment of the invention.

FIG. 2 is a block diagram 200 showing an automated design process and chip description system in accordance with an embodiment of the invention. The chip description system is used to create an object pool 204 that provides a central means for the architecture 201, micro architecture 202 and RTL to Tapeout 203 to share design flow information. An example of an object pool in accordance with an embodiment of the invention is described below in the discussion of FIG. 4 and FIG. 9.

Architecture 201 includes information relating to the following aspects of integrated circuit design: interfaces, functions, technology, packaging, modes, data rates, voltage domains, user objects, die size, test requirements, yield, IP (including memories), software interfaces, software/C models, performance metrics, and data sheet information.

Figure 3:
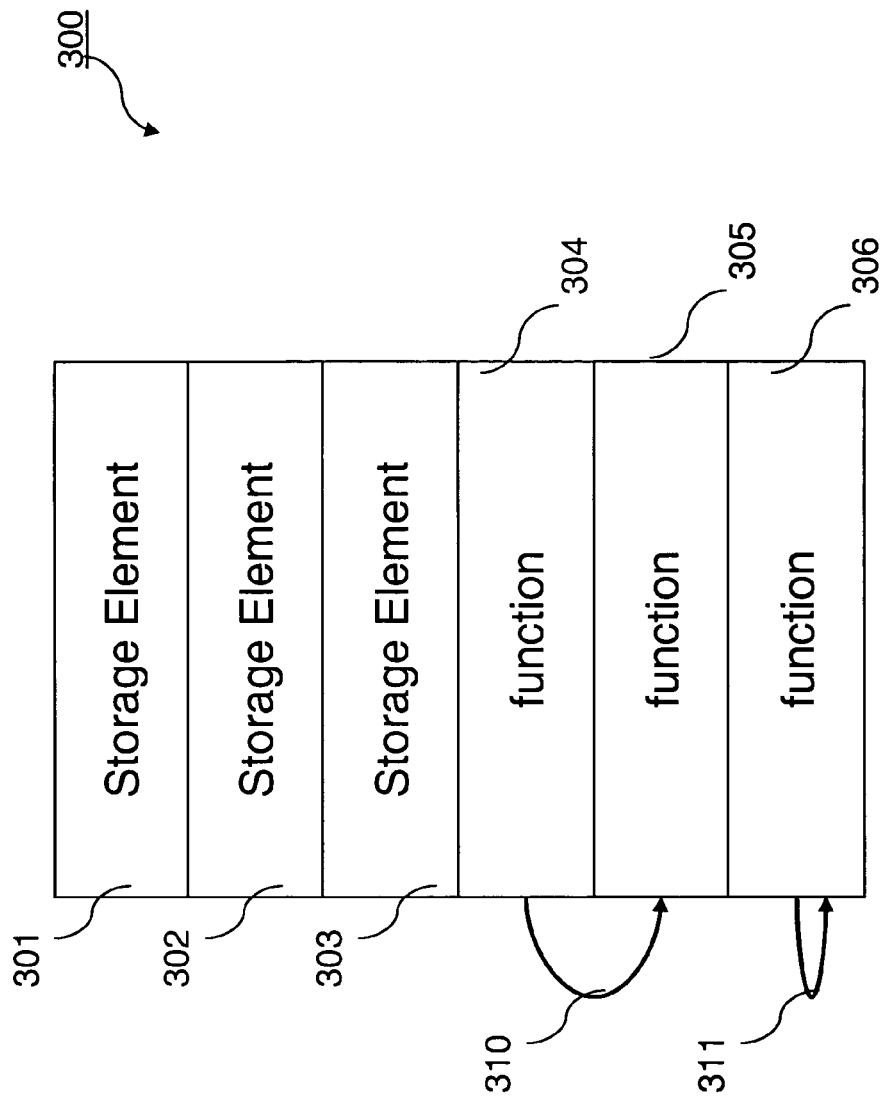
FIG. 3 is a diagram showing an example object that is used in accordance with an embodiment of the invention.

FIG. 3 is a diagram showing an example object 300 that is used in accordance with an embodiment of the invention. An object 300 includes data fields and methods. In an example embodiment of the invention, object 300 includes a plurality of data fields shown as storage elements 301-303 and a plurality of methods shown as functions 304-306. An object 300 can have any number of storage elements and functions.

Figure 9:
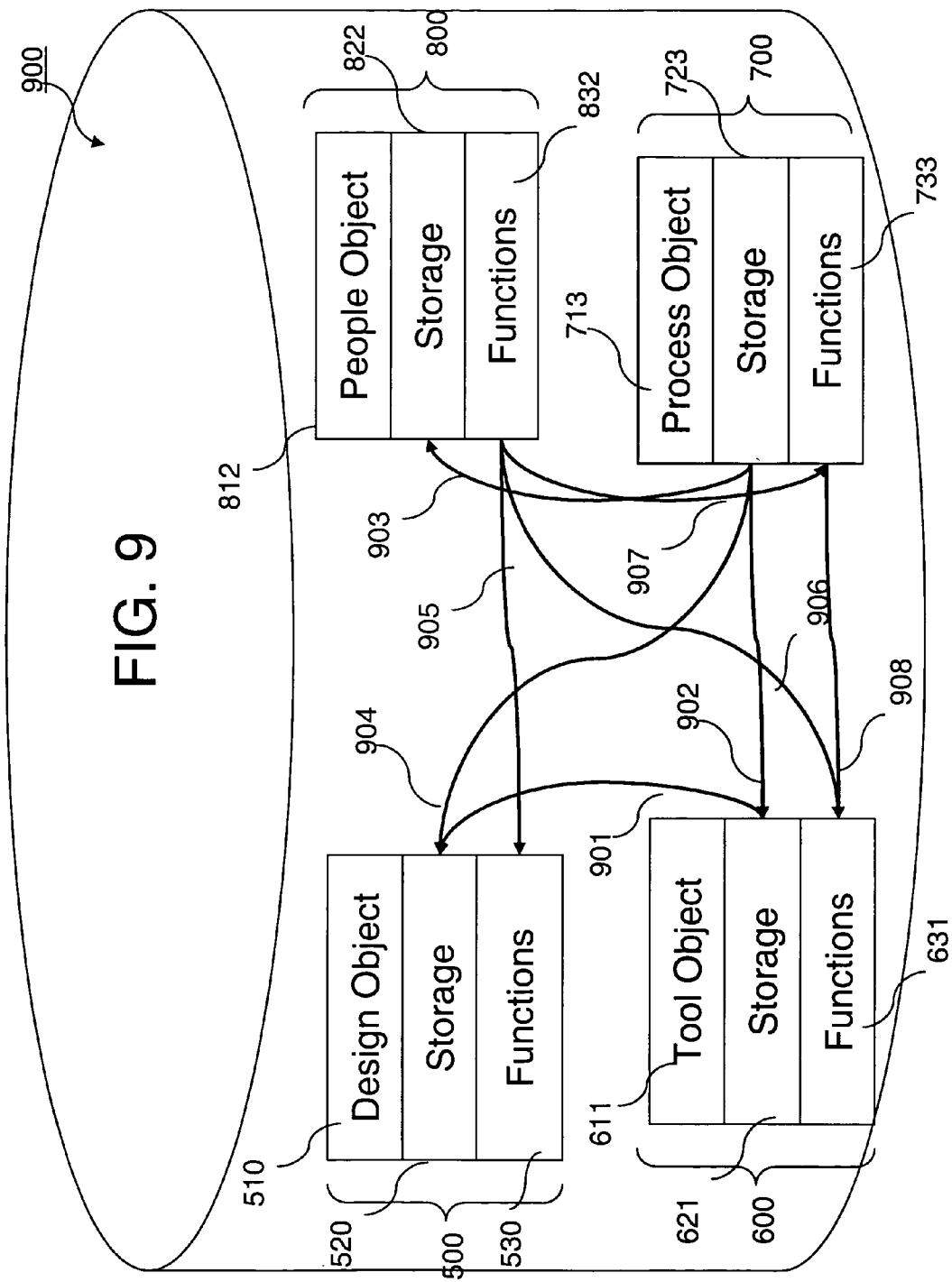
FIG. 9 is a diagram showing an example object pool and interactions among objects in accordance with an embodiment of the invention.

Methods, also called functions, and are declared in the same way as procedures or functions are declared. Methods can be used to create, modify and/or query the data field in the object containing the method or in another object. Methods can be called in a number of ways. For example, a method 304 contained in object 300 can call another method 305 contained within the same object 300, as shown by arrow 310. A method 306 can also call itself recursively, as shown by arrow 311. In FIG. 9, a method contained in object is shown calling a method contained in a different object.

Figure 4:
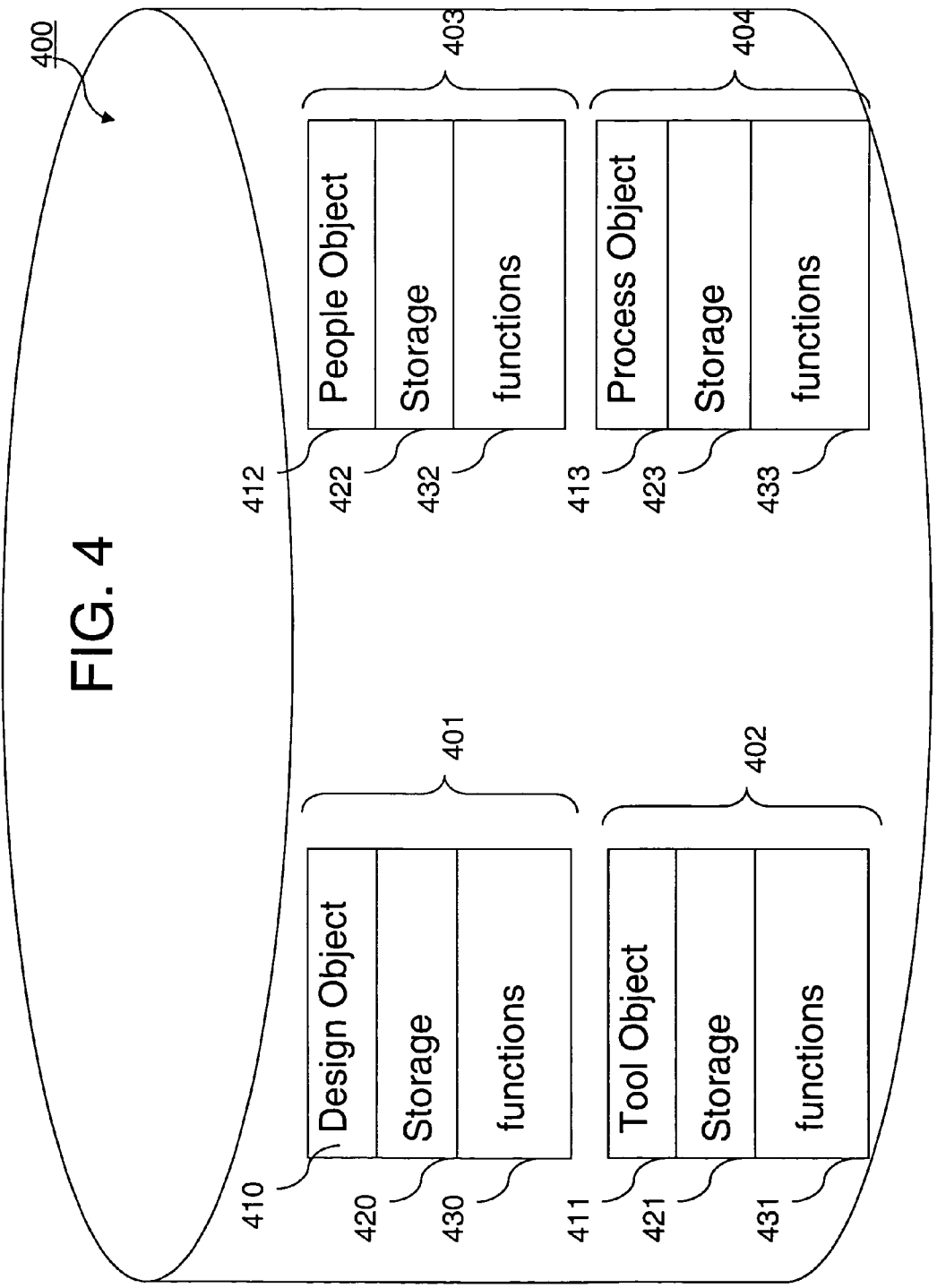
FIG. 4 is a diagram showing an example object pool and associated objects in accordance with an embodiment of the invention.

FIG. 4 is a diagram showing an example object pool 400 and associated objects 401-404 in accordance with an embodiment of the invention. Design object 401 having an object name 410 includes storage elements 420 and methods 430. Tool object 402 having an object name 411 includes storage elements 421 and methods 431. People object 403 having an object name 412 includes storage elements 422 and methods 432. Process object 404 having an object name 413 includes storage elements 423 and methods 433. Numerous additional object types can be created in accordance with embodiments of the invention. Thus, the object types listed (design, tool, people, process) should not be construed as limiting the objects to these types.

FIG. 5 is a diagram showing an example of a design object 500 in accordance with an embodiment of the invention. Design object 500 has the name "power_net" 510 and includes the storage elements 520 as shown. The storage elements include information about an indicator (shown as a signal name), a grid (shown as a DEF/PDEF fragment), and various power assertions that include a plurality of values in a list referred to as "standby_voltage." One method 530 called "calculate_decap" is shown, and includes code links to tool objects.

FIG. 6 is a diagram showing an example of a tool object 600 in accordance with an embodiment of the invention. Tool object 600 has the name "eda_tool" 611 and includes storage elements 621 and methods 631. The storage elements 621 include a plurality of variables with different values, and also includes links to design objects, shown as "logfile", "source_files" and "outputs." The methods portion 631 includes the "run" method which includes links to "logfile", "source_files" and "outputs."

FIG. 7 is a diagram showing an example of a process object 700 in accordance with an embodiment of the invention. The process object 700 is shown as having the name "eco" 712, which refers to "engineering change order," which is a term known in the art. The eco process object 700 includes storage elements 722 and methods 732. Storage elements 722 include links to design objects (shown as "changed_modules" and "bug_number") as well as a link to a people object (shown as "approval_list") and a tool object (shown as "exec"). The method 732 is called "run_eco" and includes a link to a tool object.

FIG. 8 is a diagram showing an example of a people object 800 in accordance with an embodiment of the invention. This people object 800 is shown as having the name "engineer" 813 because it is meant to be representative of an engineer on a design project. The people object 800 includes storage elements 823 and methods 833. The storage elements 833 include a plurality of variables that are assigned values as shown. The method 833 is shown as "get_eco_approval" and includes the code for implementing the method and a plurality of links to relevant design, tool and process objects.

FIG. 9 is a diagram showing an example object pool 900 and interactions among objects 500, 600, 700 and 800 in accordance with an embodiment of the invention. For example, arrows 901-904 show links from the storage section of one object to the storage section of another object. Arrow 901 refers to links from tool object 600 to design object 500 that are created by the storage elements "logfile," "source_files" and "outputs" in tool object 600. Arrow 902 refers to the links from process object 700 to tool object 600 that are created by the storage element "exec" in process object 700. Arrow 903 refers to the links from process object 700 to people object 800 that are created by storage element "approval_list" in process object 700. Arrow 904 refers to the links from process object 700 to design object 500 that are created by storage elements "changed_modules" and "bug_number" in process object 700.

Arrows 905-908 show links from the method section of one object to the method section of another object. Recursive links and links within one object are not shown in this example but are described above in the discussion of FIG. 3. Arrow 905 refers to the links from people object 800 to design object 500 that are created by the method "get_eco_approval" in people object 800. Arrow 906 refers to the links from people object 800 to tool object 600 that are created by the method "get_eco_approval" in people object 800. Arrow 907 refers to the links from people object 800 to process object 700 that are created by the method "get_eco_approval" in people object 800. Arrow 908 refers to the links from process object 700 to tool object 600 that are created by the method "run_eco" in process object 700.

Automated Multiple Voltage/Power State Design Process

Figure 10:
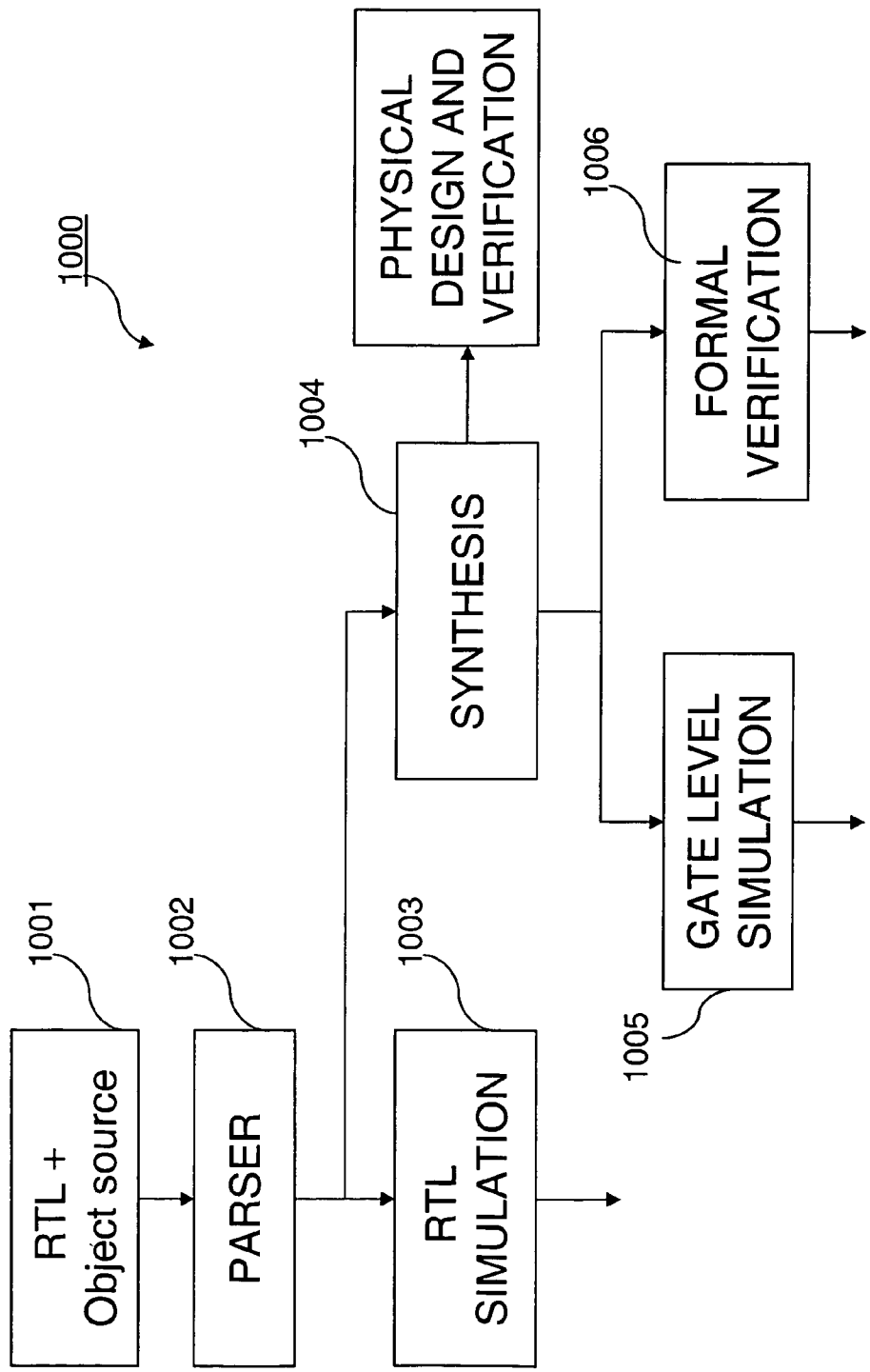
FIG. 10 is a flow chart showing steps in an automated multiple voltage/power state design process in accordance with an embodiment of the invention.

FIG. 10 is a flow chart 1000 showing steps in an automated multiple voltage/power state design process in accordance with an embodiment of the invention. An RTL and Object Source 1001 includes design definitions that are parsed 1002 by a parser that is suitable for this purpose. The output of the parser is a plurality of design objects. These design objects are the input to an RTL simulation step 1003 and a synthesis step 1004. The RTL simulation step 1003 and a synthesis step 1004 can run simultaneously in parallel. This is typical, but not necessary. The actual execution by the users varies by factors not related to the invention. The outputs of one method feed into another even for simulation and synthesis. However process objects are capable of recognizing the parallelism or lack thereof and adjust accordingly. The synthesis step 1004 accepts design objects from parsing step 1002 and synthesizes the data objects to create an output of synthesized design objects. These synthesized design objects are the input to a gate simulation 1005 and a formal verification 1006. The resulting design output objects of the gate simulation 1005 and the formal verification 1006 can be processed further.

Parsing

In an example embodiment of the invention, the parser operation 1002 includes the following steps. (Step 1) Split the code into standard HDL and CDS objects. In one embodiment of the invention, this splitting of the code into standard HDL and CDS objects is necessary for add-on applications. In another embodiment of the invention, natively compiled applications provide that this code-splitting will not be necessary. (Step 2) Tag portions of the HDL with any object annotations that are available. An object annotation is a reference made to an element of the object pool. (Step 3) For multiple voltage operation, build table that correlates the module hierarchy to the voltage island. The hierarchical or other partitioning of the chip is classified by voltage island. (Step 4) Make a list of voltage island signals and indicators. (Step 5) Read a table of voltage states and transitions for each voltage island. (Step 6) Mark all of the signals that cross over voltage islands (in space). (Step 7) Mark all signals into voltage domains. If parsing a netlist, mark all cells into voltage domains. Each cell or group of cells is classified with the identification of the voltage island they must be connected to. (Step 8) Mark all methods and assertions specified. (Step 9) Build a voltage island hierarchy table. "Always on" domains are at the top of the hierarchy. A domain is higher than the other if the former is "on" (operational) when the latter is capable of being "off" (standby and shutdown), as well as the former is not "off" when the latter is "on". (Step 10) Generate standard HDL code as output and save the database of CDS objects and related data built by the parser into separate files/directories. The database of CDS objects is called the object pool.

RTL Simulation

In an example embodiment of the invention, the RTL simulation 1003 includes the following steps: (Step 1) Assume correct isolation and level shifting. (Step 2) Identify all voltage island signals and their indicators, by getting this information from the object pool. (Step 3) Look for special isolation and level shifting directives from the source code and annotate modules and signals as applicable by getting this information from the object pool. (Step 4) At each timestep of simulation, read the values of the voltage island signals and indicators. (Step 4*a*) Perform checks for the legality of the values and their sequences, for example, with respect to previous states of such signals.

(Step 4*b*) If there is no change in the voltage island signals, this indicates that the simulator assigned values for the logic are acceptable. (Step 4*c*) If there is a voltage change, use the look-up technology table (provided by project setup) for the conversion to logic values. (Step 4*d*) Assign 1, 0, X, Z to all signals in each voltage island and to cross-over signals. These are the values understood by both engineers and commercial tools. There are more states possible, but they are all variations of these 4. (Step 4*di*) If standby, maintain state elements. Treat the combinatorial outputs as "X" unless the user has indicated a specific logic value. (Step 4*dii*) If shutdown, all signals in that voltage domain go to logic 0. Standby and shutdown are states that can attained by manipulation of voltage and/or clocks. Our simulator is cognizant of these states and their implications whereas simulators in prior art were not.) (Step 4*diii*) In standby, corrupt state elements to logic "X" if error condition occurs in step (i) below. This is a variation of Step (4*di*) where there is a functional error (Step 4*h*) Reassign crossover signals in receiving domains with isolated and level shifted values, as applicable to voltage relations. (Step 4*f*) Perform maintenance and annotation functions for (Step 4*a*) if applicable. This will improve performance as well as make coding easier. (Step 4*g*) Perform assertion checks on the voltage island signals, if available. (from object pool). (Step 4*h*) Send output messages and data as needed by the simulation. (Step 5) Repeat step 4 until the simulation finishes. (Step 6) Populate vector objects in object pool. Populate power calculation objects in object pool.

Gate Level Simulation

In an example embodiment of the invention, the gate level simulation 1005 includes the following steps. (Step 1) Do not assume isolation/level shifting. (Step 2) Identify all voltage island signals and their indicators (from object pool). (Step 3) Look for special isolation/level shifting directives from Source code and annotate modules/signals as applicable (from object pool). (Step 4) At each timestep of simulation, read values of voltage island signals and indicators. (Step 4*a*) Perform check for legality of value and sequence, with respect to the previous states of such signals. (Step 4*b*) If there is no change in the voltage island signals, then the simulator assigned values for logic are acceptable. (Step 4*c*) If there is a voltage change, use the look-up technology table (provided by project setup) for conversion to logic values. (Step 4*d*) If there are voltage change, power and delay calculations, then process them by looking them up in the library or by using another set of values provided by user (e.g. SDF file, k factors etc.). (Step 4*e*) If voltage changes to shutdown level, power is zero. In standby, only the leakage power applies. No delay calculations need to be made in these states. (Step 4*f*) Assign 1, 0, X, Z to all signals in each voltage island and to cross over signals. (Step 4*fi*) If standby, then maintain state elements. Treat combinatorial outputs as "X" unless user indicated a specific logic value. (Step 4*fii*) If shutdown, all signals in that voltage domain go to logic 0. (Step 4*fiii*) In standby, corrupt state elements are set to logic "X" if error condition occurs in step (4*i*) below. (Step 4*g*) Reassign crossover signals in receiving domains with isolated/level shifted values if applicable. (Step 4*h*) Perform maintenance/annotation functions for step 4*a* if applicable. This will improve performance as well as make coding easier. (Step 4*i*) Perform assertion checks on voltage island signals, if available. (from object pool) (Step 4*j*) Send output messages and data as needed by simulation. (Step 7) Repeat step 4 until simulation finishes. (Step 8) Populate vector objects in object pool. Populate power calculation objects in object pool.

Synthesis

In an example embodiment of the invention, the synthesis step 1004 includes the following steps. For each signal in object pool that crosses voltage islands, do the following: (Step 1) identify the following relationships: (Step 1*a*) same voltage-same voltage crossing (no action). (Step 1*b*) Source voltage>target voltage crossing (no action). (Step 1*c*) Source voltage<target voltage crossing (level shift in target). (Step 1*d*) Shutdown—operational voltage crossing (isolation in target). (Step 1*e*) Standby-operational crossing with park 0 value (isolation in source). (Step 2) Ideally, each signal should have only one of the above relationships. In real life, most signals will have relationship (1*a*) and one of the others (1*b* through 1*e*). If there is a multitude of (1*b*-1*e*) relationships on the same signal, the user must be notified. (Step 3) insert isolation/level shifting logic on the signals as needed. If necessary, add correct indicator signals to the port list of the module being changed. (Step 4) partition code according to voltage islands and submit to tool/process objects specified by the user. After tool/process make the appropriate mapping and optimization changes, recheck for consistency with object pool. (Step 5) Insert object pool syntactical tokens into the netlist for use by downstream processes and tools. (Step 6) Send reports, log files, messages etc. to object pool. (Step 7) Update object pool parameters (storage elements in objects) as needed.

Formal Verification

In an example embodiment of the invention, the formal verification process 1006 includes the following steps.

For each module in the design, the following steps are performed: (Step 1) check if voltage connectivity in RTL source is the same as netlist. (Step 2) If equivalent, pass message to user. (Step 3) If not equivalent, identify failing modules and voltage nets to user. (Step 4) Populate object pool with status and messages.

For each voltage state of the design, the following steps are performed: (Step 1) Form 1, 0, X, Z relationships for crossover signals from the object pool. (Step 2) Launch formal verification tool object/method using the relationships of (Step 1) as a base. (Step 3) populate object pool with status and messages.

For each special signal (clock, reset, scan, other high fanout nets, indicator), the following steps are performed: (Step 1) Check that the buffer tree is entirely connected to the same voltage domain. (Step 2) Check that the indicator for each domain is on ("driven") when the domain is in standby and shutdown. This implies that the indicator must be driven by a higher order voltage domain. (Step 3) Check that the scan chain does not cross voltage domains. (Step 4) Populate object pool with status and messages.

A special application of formal verification is to check the equivalence between schematic representation (netlist) and layout representation, a process known as LVS. In current multiple voltage designs, this process is done by adding an artificial power supply terminal modification to the library and processing the result of standard tools to indicate connectivity of the cells to voltage domains.

In an embodiment of the invention, such a connectivity indication is accomplished seamlessly and hence, can be used to invoke the LVS tool object without intervening processing by the user or programs. Further, such a connectivity indication may be applied to the representation of package connectivity, hence more completely verifying the chip.

Power Verification

In an embodiment of the invention, an automated multiple voltage/power state design process further comprises a power verification process. An example of the power verification process includes the following steps.

(Step 1) For each current/power parameter that has to be measured. (Step 1a) Define scope of objects based on user selection and/or physical design information such as placement or voltage domain. (Step 1b) Calculate power from the standard CMOS formulae at each timestep. (Step 1c) Compute desired function such as peak, average, minimum, RMS on the power data. (Step 1d) Estimate current as Voltage/Power for each voltage domain. (Step 1e) Apply desired calculations related to current and power. For example, for current fluctuations over time, take a user specified time interval and calculate current fluctuations in the interval to compute the maximum such fluctuation. (Step 1f) Populate design objects with the calculated power parameters. This will be driven by tool objects. (Step 1g) Tool objects will hence utilize such design objects related to power in their calculations and methods to satisfy design objects related to packaging, thermal analysis, current delivery, power density etc., as specified by the user and as required by silicon technology.

Physical Design

In an embodiment of the invention, an automated multiple voltage/power state design process further comprises a physical design process. For example, a physical design is divided into 5 broad tool objects which accomplish the following steps. (Step 1) Power grid generation and analysis of multiple voltage networks. (Step 2) Placement of cells in a multiple voltage grid. (Step 3) Clock tree and other high fanout net connectivity as well as Scan chain formation. (Step 4) Routing of nets in a multiple voltage grid environment. (Step 5) Packaging interface.

The following methods are written in the context of utilizing tool objects provided by an external source of such software. It is possible to integrate such functionality into tool objects and gain operational efficiency. The purpose of the methods, to provide formalism and seamless communication in order to achieve correct device operation is unaffected by such an integration.

While existing EDA tools can perform these tasks today, they do so with varied amounts of manual intervention at each step, lacking the ability to automatically extract desired parameters from other design objects. They further lack the ability to communicate modified design parameters to the subsequent stages in the flow without manual processing by the user.

Power Grid Generation

The function of a power grid is to supply electrical current to the transistor devices on an IC within the range of voltages allowed, at all times. On an IC with multiple voltage states, such a desired voltage varies with time as well as from one transistor group to another. In an embodiment of the invention, an automated multiple voltage/power state design process further comprises a power grid generation process. An example of the power grid generation process includes the following steps. (Step 1) Apply parser to the multiple voltage netlist design object. Determine the cell distribution among voltage domains. (Step 2) Perform a weighting of area among the voltage domains and allocate percentage area of the die size to each domain. (Step 3) Query power_net and user design objects for user input on grid generation. This is usually done to seed the placement of the grids. (Step 3) If (Step 3) does not indicate complete grid generation, use the percentage areas to perform rectilinear partitions of the die. For example, if the area of domain1 is 35% and domain2 is 65%, allocate 35% area to domain 1 and rest to domain 2. (Step 5) Determine placement of each domain by identifying interface connectivity. If multiple domains interact, the domain with more critical timing takes higher priority. If timing is equally critical, the domain with larger size takes higher priority. These rules can be changed by user objects or other tool objects. (Step 6) Within each percentage area, perform routing of the power grid in horizontal and vertical directions. The parameters for the thickness of each wire and spacing between wires are determined by the users, foundry or library vendors. (Step 6a) If there is an absence of parameters, set the spacing to twice the row height of library. Set the width to four times the track width of the library. (Step 7) Mark the X,Y co-ordinates of each voltage domain into its design object.

Placement of Cells in a Multiple Voltage Grid

In an embodiment of the invention, an automated multiple voltage/power state design process further comprises a process for the placement of cells in a multiple voltage grid. An example of process for the placement of cells in a multiple voltage grid includes the following steps. (Step 1) From 6-1 of Grid generation, we know the assignment of cells in each voltage domain. (Step 2) For each voltage domain, (Step 2a) Generate a hard (irrevocable) placement property on all cells to be bounded by the X,Y co-ordinates of each voltage domain. (Step 2b) Generate constraint to tool object and invoke for placement. (Step 3) Write netlist after placement. Apply parser tool object to determine if any additional buffer/mapping cells were added by the placement tool object. (Step 4) Determine voltage domain assignment of all such additional cells. (Step 4a) If a buffer was inserted on a cross over signal, allocate it to the source domain. (Step 5) Repeat Steps 2-4 until no new cells are added. If number of iterations exceeds a user specified limit, exit the process with a message to the user. This is an example of an iteration that can be integrated into the tool object for operational efficiency.

Clock Tree, High Fanout and Scan Chain Insertion

In an embodiment of the invention, an automated multiple voltage/power state design process further comprises processes for clock tree, high fanout and scan chain insertion. Examples of processes for clock tree, high fanout and scan chain insertion are described below. The guiding principle of all such operations is that a signal may not cross voltage domains in its distribution across a large number of cells.

For each clock tree and high fanout net, the following steps are performed. (Step 1) Partition cells in fanout of each network by voltage domain. (Step 2) For each voltage domain, (Step 2a) Apply a hard placement obstruction directive to the rest of the die, not the domain's XY co-ordinates. (Step 2b) Apply a fixed, immutable attribute to all cells outside the voltage domain. (Step 2c) Perform Clock tree synthesis on all clocks and high fanout nets with fanout in this voltage domain. (Step 2d) Note that this is an alternate method to perform placement of all cells in this voltage domain. (Step 2e) Remove attributes set in steps (a,b)

For scan chain construction, the following steps are performed. (Step 1) Create/use a single scan chain input and scan chain output configuration per voltage domain, unless user specifies otherwise. (Step 2) For each voltage domain: (Step 2a) Apply a do not scan directive to all state elements outside of the domain. (Step 2b) Perform scan stitch operation in tool object. (Step 2c) Remove do not scan directive applied in (Step 2a). (Step 3) At the top level, connect the scan chain inputs and outputs only to nets in the default, always on power domain, unless specified by user.

Routing

If the silicon technology and user allow the routes of multiple voltage domains to be interspersed, then the default router tool object can be used. However, this is frequently not the case. In such cases, the routing process described below must be followed. In an embodiment of the invention, an automated multiple voltage/power state design process further comprises a routing process. An example of this routing process includes the following steps. For each voltage domain: (Step 1) Obtain a list of signals in the domain from the parser tool object. (Step 2) Apply a routing obstruction to the area outside of the domain's co-ordinates. (Step 3) Invoke the router on the signals of the current voltage domain. (Step 4) Remove obstruction set in (Step 2).

The foregoing described embodiments of the invention are provided as illustrations and descriptions. They are not intended to limit the invention to the precise form described. In particular, it is contemplated that functional implementations of the invention described herein may be implemented equivalently in hardware, software, firmware, and/or other available functional components or building blocks, and that networks may be wired, wireless, or a combination of wired and wireless. Other variations and embodiments are possible in light of the above teachings. This, it is intended that the scope of invention is not limited by this Detailed Description, but rather by the following Claims.

I claim:

1. A computer-executed method for designing a circuit with multiple voltage domains, the method comprising:
    parsing, by using a computer, a description of a circuit design which includes multiple voltage domains to obtain: a parsed design which identifies signals that cross voltage domains, and a voltage domain hierarchy such that a first voltage domain in the voltage domain hierarchy is always off whenever a second voltage domain which is above the first voltage domain in the voltage domain hierarchy is off;
    performing register transfer logic (RTL) simulation using the parsed design, which includes: assigning a don't care symbol to signals in voltage domains in standby mode, assigning logic value "0" to signals in voltage domains in shutdown mode, and not modifying logic values which did not change from a previous simulation timestep;
    performing gate level simulation using the parsed design, which includes: using a leakage power value for voltage domains in standby mode, using a zero power value for voltage domains in shutdown mode, and not performing delay calculations in voltage domains that are in standby or shutdown mode;
    synthesizing the parsed design to obtain a synthesized design, wherein for each signal that crosses voltage domains, synthesizing the parsed design includes: inserting level shifting logic if the signal crosses from a low voltage domain to a high voltage domain, and not inserting level shifting logic if the signal crosses from a high voltage domain to a low voltage domain;
    performing formal verification on the synthesized design, which includes automatically checking if: a voltage domain indicator signal for a first voltage domain is driven by a second voltage domain that is higher than the first voltage domain in the voltage domain hierarchy, signals associated with scan chains do not cross voltage domains, and buffer trees do not cross voltage domains; and
    performing placement and routing on the synthesized design to obtain a placed and routed design, wherein performing placement and routing includes:
    generating a placement constraint for each cell associated with a third voltage domain to ensure that each cell associated with the third voltage domain is placed in an area associated with the third voltage domain, and generating placement and routing constraints for clock trees to ensure that each clock tree is placed and routed within a single voltage domain.

2. A non-transitory computer-readable storage medium storing instructions that when executed by a computer cause the computer to perform a method for designing a circuit with multiple voltage domains, the method comprising:
    parsing a description of a circuit design which includes multiple voltage domains to obtain: a parsed design which identifies signals that cross voltage domains, and a voltage domain hierarchy such that a first voltage domain in the voltage domain hierarchy is always off whenever a second voltage domain which is above the first voltage domain in the voltage domain hierarchy is off;
    performing register transfer logic (RTL) simulation using the parsed design, which includes: assigning a don't care symbol to signals in voltage domains in standby mode, assigning logic value "0" to signals in voltage domains in shutdown mode, and not modifying logic values which did not change from a previous simulation timestep;
    performing gate level simulation using the parsed design, which includes: using a leakage power value for voltage domains in standby mode, using a zero power value for voltage domains in shutdown mode, and not performing delay calculations in voltage domains that are in standby or shutdown mode;
    synthesizing the parsed design to obtain a synthesized design, wherein for each signal that crosses voltage domains, synthesizing the parsed design includes: inserting level shifting logic if the signal crosses from a low voltage domain to a high voltage domain, and not inserting level shifting logic if the signal crosses from a high voltage domain to a low voltage domain;
    performing formal verification on the synthesized design, which includes automatically checking if: a voltage domain indicator signal for a first voltage domain is driven by a second voltage domain that is higher than the first voltage domain in the voltage domain hierarchy, signals associated with scan chains do not cross voltage domains, and buffer trees do not cross voltage domains; and
    performing placement and routing on the synthesized design to obtain a placed and routed design, wherein performing placement and routing includes: generating a placement constraint for each cell associated with a third voltage domain to ensure that each cell associated with the third voltage domain is placed in an area associated with the third voltage domain, and generating placement and routing constraints for clock trees to ensure that each clock tree is placed and routed within a single voltage domain.

3. A system for designing a circuit with multiple voltage domains, the system comprising:

a parsing module configured to parse a description of a circuit design which includes multiple voltage domains to obtain: a parsed design which identifies signals that cross voltage domains, and a voltage domain hierarchy such that a first voltage domain in the voltage domain hierarchy is always off whenever a second voltage domain which is above the first voltage domain in the voltage domain hierarchy is off;

a register transfer logic (RTL) simulation module configured to perform RTL simulation using the parsed design, wherein performing RTL simulation includes: assigning a don't care symbol to signals in voltage domains in standby mode, assigning logic value "0" to signals in voltage domains in shutdown mode, and not modifying logic values which did not change from a previous simulation timestep;

a gate level simulation module configured to perform gate level simulation using the parsed design, wherein performing gate level simulation includes: using a leakage power value for voltage domains in standby mode, using a zero power value for voltage domains in shutdown mode, and not performing delay calculations in voltage domains that are in standby or shutdown mode;

a synthesizing module configured to synthesize the parsed design to obtain a synthesized design, wherein for each signal that crosses voltage domains, synthesizing the parsed design includes: inserting level shifting logic if the signal crosses from a low voltage domain to a high voltage domain, and not inserting level shifting logic if the signal crosses from a high voltage domain to a low voltage domain;

a verification module configured to perform formal verification on the synthesized design, wherein performing formal verification includes automatically checking if: a voltage domain indicator signal for a first voltage domain is driven by a second voltage domain that is higher than the first voltage domain in the voltage domain hierarchy, that signals associated with scan chains do not cross voltage domains, and buffer trees do not cross voltage domains; and a placement and routing module configured to perform placement and routing on the synthesized design to obtain a placed and routed design, wherein performing placement and routing includes: generating a placement constraint for each cell associated with a third voltage domain to ensure that each cell associated with the third voltage domain is placed in an area associated with the third voltage domain, and generating placement and routing constraints for clock trees to ensure that each clock tree is placed and routed within a single voltage domain.

* * * * *

UNITED STATES PATENT AND TRADEMARK OFFICE
CERTIFICATE OF CORRECTION

PATENT NO.       : 7,984,398 B1
APPLICATION NO.  : 11/180404
DATED            : July 19, 2011
INVENTOR(S)      : Srikanth Jadcherla Page 1 of 1

It is certified that error appears in the above-identified patent and that said Letters Patent is hereby corrected as shown below:

At column 14, line 14, delete the word "that" before the word signals so that the sentence reads "domain hierarchy, signals associated with scan".

Signed and Sealed this
Thirtieth Day of August, 2011

David J. Kappos
*Director of the United States Patent and Trademark Office*